(12) United States Patent
Culley et al.

(10) Patent No.: US 6,182,236 B1
(45) Date of Patent: Jan. 30, 2001

(54) CIRCUIT AND METHOD EMPLOYING FEEDBACK FOR DRIVING A CLOCKING SIGNAL TO COMPENSATE FOR LOAD-INDUCED SKEW

(75) Inventors: Paul R. Culley, Tomball; Hung Q. Le, Katy, both of TX (US)

(73) Assignee: Compaq Computer Corporation, Houston, TX (US)

( * ) Notice: Under 35 U.S.C. 154(b), the term of this patent shall be extended for 0 days.

(21) Appl. No.: 09/140,146

(22) Filed: Aug. 26, 1998

(51) Int. Cl.[7] ................................ G06F 1/04; G06F 1/24; G06F 11/00
(52) U.S. Cl. .................. 713/503; 713/500; 713/501; 713/400; 713/401; 714/700; 327/149; 327/152; 375/371
(58) Field of Search .................. 713/500, 501, 713/502, 503, 400, 401; 714/700; 327/149, 156, 152; 375/371

(56) References Cited

U.S. PATENT DOCUMENTS

| | | | |
|---|---|---|---|
| 4,309,649 | * | 1/1982 | Naito ................................. 323/212 |
| 4,637,018 | * | 1/1987 | Flora et al. ............................ 371/1 |
| 4,686,482 | * | 8/1987 | Zoetman et al. ..................... 328/164 |
| 4,754,164 | * | 6/1988 | Flora et al. ......................... 307/269 |
| 4,831,338 | * | 5/1989 | Yamaguchi .......................... 331/1 A |
| 5,079,519 | * | 1/1992 | Ashby et al. ........................ 331/1 A |
| 5,087,829 | * | 2/1992 | Ishibashi et al. .................... 307/269 |
| 5,101,117 | * | 3/1992 | Johnson et al. ..................... 307/269 |
| 5,122,679 | * | 6/1992 | Ishii et al. ............................ 307/269 |
| 5,218,314 | * | 6/1993 | Efendovich et al. ................ 328/155 |
| 5,268,656 | | 12/1993 | Muscavage . |
| 5,272,390 | * | 12/1993 | Watson, Jr. et al. ................. 307/269 |
| 5,309,035 | | 5/1994 | Watson, Jr. et al. . |
| 5,446,867 | | 8/1995 | Young et al. . |
| 5,488,641 | * | 1/1996 | Ozkan ................................. 375/374 |
| 5,652,530 | | 7/1997 | Ashuri . |
| 5,790,611 | * | 8/1998 | Huang et al. ........................ 375/371 |

* cited by examiner

Primary Examiner—Robert W. Beausoliel, Jr.
Assistant Examiner—Robert G. Crockett
(74) Attorney, Agent, or Firm—Kevin L. Daffer; Conley, Rose & Tayon

(57) ABSTRACT

A clock generation circuit is provided within an electronic computer system to adjust the phase of a clocking signal provided to various subsystems of the electronic system. A first phase-locked loop (PLL) is provided to establish multiple phases of a first reference clock. One of those phases is selected as a second reference clock, and a second PLL synchronizes the clocking signal to that second reference clock. Each subsystem and associated load which receives the clocking signal has a corresponding clock generation circuit comprising the second PLL. The second PLL for one subsystem can adjust the clocking signal phase prior to that subsystem receiving the clocking signal. The amount by which the second PLL adjusts phase on clocking signal may be different than that by which another, second PLL adjusts the clocking signal arriving on another subsystem. In all instances, however, the clocking signal arriving at the various subsystems are independently and variably changed to match the unique load characteristics of each subsystem using feedback of the clocking signal to the input of each respective second PLL.

22 Claims, 2 Drawing Sheets

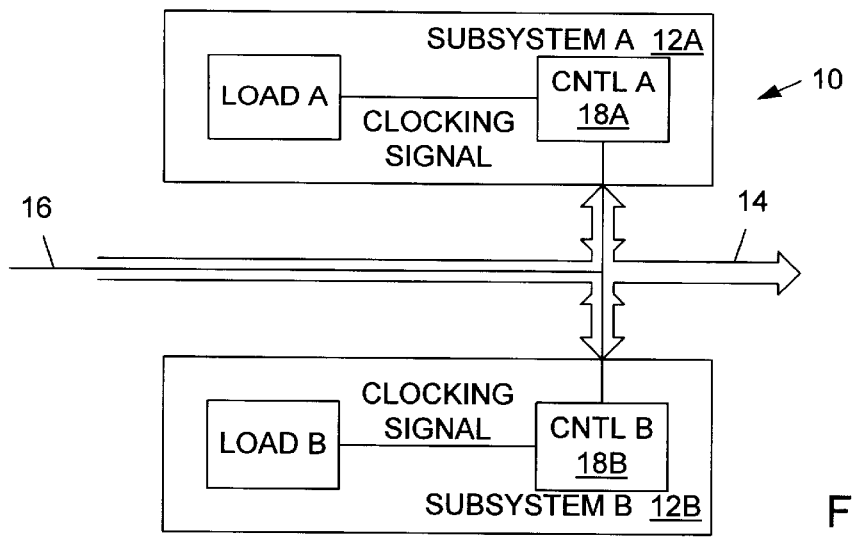
FIG. 1
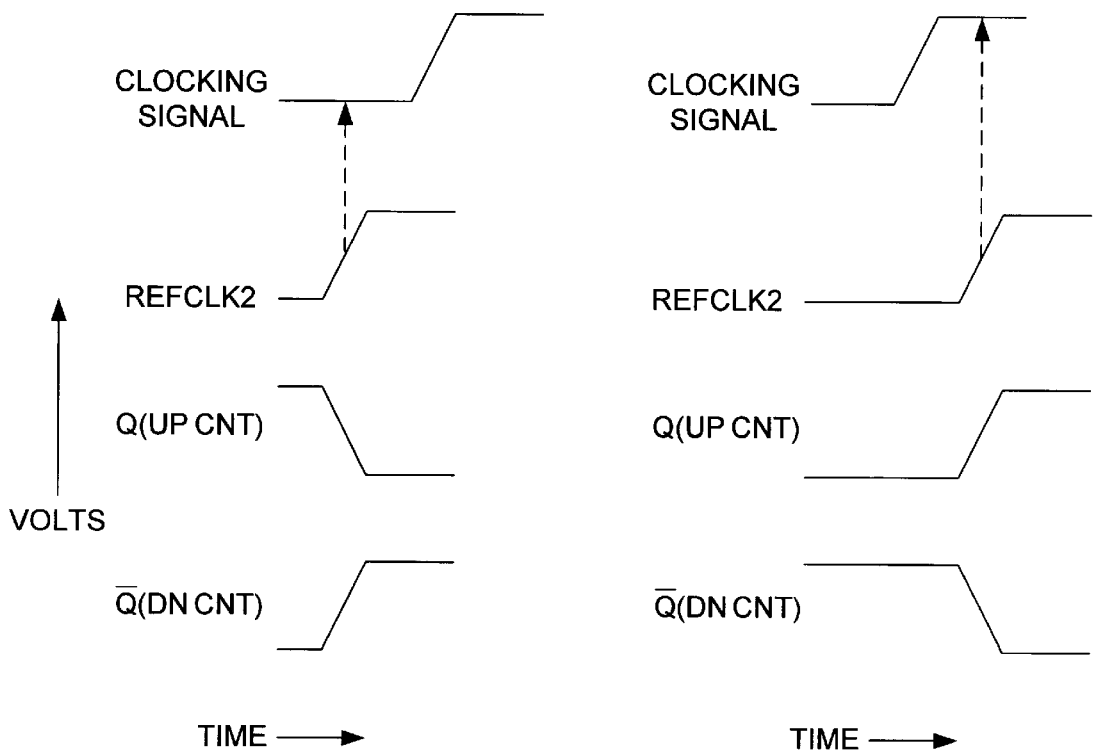
FIG. 3
FIG. 4

CIRCUIT AND METHOD EMPLOYING FEEDBACK FOR DRIVING A CLOCKING SIGNAL TO COMPENSATE FOR LOAD-INDUCED SKEW

BACKGROUND OF THE INVENTION

1. Field of the Invention

This invention relates to an electronic system and, more particularly, to the distribution of a clock signal among multiple subsystems of the electronic system with minimal differential (i.e., "skew") among times in which the clock transitions arrive at select subsystems.

2. Description of the Related Art

An electronic system, such as a computer or microprocessor encompasses numerous subsystems necessary to carry out its intended function. A subsystem which utilizes a clock signal is defined as any component (active or passive) which triggers from the clock signal, or may include multiple components coupled together in sequential fashion. Interconnected transistor and resistor components include, for example, a flip-flop, latch, register, etc. A subsystem may be sufficiently large and contain multiple sequential elements coupled together to carry out a systematic result.

Regardless of the relative size of a subsystem, it is important that a sequential subsystem be clocked or modulated by a clocking signal. Thus, the subsystem requires a clocking signal input to the subsystem to control reception and transfer of data also arriving upon the subsystem.

Proper operation of an electronic system requires that system be synchronized with the clocking signal. Thus, the clocking signal should arrive at select subsystems at the same time. Otherwise, reliable data reception and transmission is not ensured. For example, if data is clocked into one subsystem later than data is clocked into another, the earlier-clocked data may contend with and destroy the later-clocked data before that data is properly stored. The problem of data contention and the lack of concurrency by which the clocking signal arrives at each of the synchronized subsystems is often referred to as "clock skew". Increases in clock skew correspondingly increases the amount of time that the data must remain stable on the bus and/or conductor. This, in turn, will increase the time required for each data transfer on the bus and therefore will reduce the speed of the bus. A conventional solution to clock skew involves accounting for differences in arrival time by buffering distally located subsystems. This requires knowing where the subsystems are located relative to one another—either their location within a monolithic silicon substrate or within a printed circuit board (PCB) between monolithic silicon. Knowing which subsystem is to receive a buffered clocking signal also assumes that the designer can forecast an accurate propagation delay from the clocking source to each destination fed by the clocking signal. Knowing the relative location and propagation delay is difficult to accurately model especially since clock skew will vary depending on fabrication processes and operating temperatures.

It would be desirable to seek an electronic system employing a clock generation circuit which can account (i.e., compensate) for varying clock skews while the electronic system is operating. Operating conditions of the electronic system ensures an accurate indication of the actual clock skew. Knowing the actual clock skew and offsetting that clock skew immediately at the clock signal destination would prove advantageous. It would be further beneficial for the improved clock generation circuit to be used at multiple subsystems to account for the dissimilar clock skews among those subsystems. The clock skews can arise from dissimilar resistive and capacitive loads seen across multiple subsystem destinations of a single conductor carrying the clocking signal. Accordingly, the desired electronic system can make the clocking transitions occur more quickly in greater skew subsystems and yet make the clocking transitions occur less quickly in lesser skew subsystems, each of which are coupled to a single conductor containing the clocking signal.

SUMMARY OF THE INVENTION

The problems outlined above are in large part solved by an improved electronic system, clock generation circuit and method hereof. The present electronic system incorporates a clock generation system prior to and within one or more subsystems which receive a single clocking signal. The clock generation signal either advances or delays the clocking signal depending on the amount of load associated with the particular subsystem to which it is connected. As such, a clocking signal forwarded to multiple subsystems can be adjusted (i.e., phase-skewed) by the clock generation circuit prior to it being received upon the respective subsystem. Adjusting the clocking signal arriving upon a plurality of subsystems ensures data is received, processed, and transferred synchronously among those subsystems. Accordingly, the duration at which the data must remain stable can be significantly reduced, thereby increasing the overall speed of the electronic system.

At least one subsystem associated with the electronic system may include a clock generation circuit to offset or compensate for skew induced upon the clocking signal by the subsystem. It is known that different subsystems have different loads and therefore attribute different skews to clocking signals fed to those subsystems. The present clock generation circuit offsets differences in skews to insure the phase and/or transitions of a clocking signal arrives at each subsystem at relatively the same time.

According to one embodiment, the clock generation circuit includes a clocking signal adapted to clock a load associated with a subsystem to which the clock generation circuit is attributed. A first reference clock is provided to the clock generation circuit and comprises a plurality of phases. A first phase of the first reference clock can be chosen as a second reference clock. A selection unit is coupled to receive the clocking signal and the second reference clock to select a second phase of the first reference clock. The second phase is used to drive the clocking signal based on the timed relationship between the second reference clock and the clocking signal.

According to yet another embodiment, the first reference clock is fed into a phase detector of a first phase-locked loop ("PLL"), along with the output of a voltage controlled oscillator also associated with the first PLL. The voltage controlled oscillator may include a series-connected chain of inverters. Taps from select outputs of those inverters are designed to carry multiple phases of the first reference clock, one of which is chosen as the second reference clock.

According to yet another embodiment, the clock generation circuit includes a second PLL. Similar to the first PLL, the second PLL employs feedback and a phase comparison between a feedback signal and a reference signal. While the first PLL compares the voltage controlled oscillator output to the first reference clock, the second PLL compares the clocking signal to the second reference clock. If the clocking signal is phase shifted (or skewed) relative to transitions of the second reference clock, then the second PLL will select another phase (or another tap) derived from the inverter chain. This will cause an earlier or later phase of the first reference clock to be driven upon the clocking signal. Eventually, the proper tap will be selected to ensure the clocking signal is phase synchronized with the second reference clock similar to phase synchronization between the voltage controlled oscillator output and the first reference clock.

Employing a cascaded arrangement of two PLLs allows accurate measurement of skew attributed to the clocking signal. The clocking signal and, more importantly, the skew upon that clocking signal is fed back to the input of the second PLL where it is compared with the second reference clock. For example, if the clocking signal resulting from a large load condition lags the second reference clock, then the second PLL operates as a selection unit by selecting an earlier tap or phase of the first reference clock generated from the first PLL. The second PLL not only selects an earlier phase, but drives that phase upon the clocking signal previously provided as the feedback signal to the second PLL. The earlier phase driven onto the clocking signal ensures the clocking signal is shifted from its previous lagging position to a position which is now, hopefully, phase synchronized with the reference clock.

The second reference clock is chosen from among multiple taps of the inverter chain by programming a particular tap from which it is derived. According to one example, the user may program the second reference clock similarly across all subsystems which are to receive a concurrent clocking signal. If the same tap is used to generate the second reference clock, then the second PLL can select another tap unique to the skew attributed only to the particular subsystem on which the second PLL is coupled. Accordingly, a single first PLL is used to generate multiple phases of a first reference clock and the second PLL can be attributed to a specific subsystem to select the appropriate phase for the load attributed to that subsystem. Thus, multiple second PLLs may be used to accommodate multiple subsystems and the uniquely varying loads of those subsystems. The phases of the first reference clock are equally spaced and can vary, a preferable number, e.g., 32. The number of second PLLs can also vary depending on the number of subsystem clocking signals requiring compensation.

According to yet another embodiment, a method is contemplated for compensating for skew-induced loading upon a clocking signal provided to one or more subsystems. The method includes feeding back a voltage controlled oscillator output to the first PLL and locking the voltage-controlled oscillator output in phase with a first reference clock. A first phase of the voltage-controlled oscillator output is selected as the second reference clock. The clocking signal is fed back to a second PLL where the clocking signal is eventually locked in phase with the second reference clock by selecting a second phase of the voltage-controlled oscillator output to be driven upon the clocking signal.

The first phase of the voltage-controlled oscillator output (or second reference clock) may occur at the same time or earlier than the first reference clock depending on which tap the second reference clock is derived. The first PLL is essentially an analog PLL using an inverter chain as the voltage-controlled oscillator. The second PLL is deemed a digital PLL, and includes a selection unit for selecting a particular phase from the inverter chain to be driven upon the clocking signal. According to one embodiment, the second PLL, and specifically the selection unit, includes a flip-flop, and up-down counter and a first multiplexer. To establish the second reference clock placed upon the input of the second PLL, a second multiplexer is provided, along with a clock control unit for programmably selecting a phase from the inverter chain by programming an output from the clock control unit.

BRIEF DESCRIPTION OF THE DRAWINGS

Other objects and advantages of the invention will become apparent upon reading the following detailed description and upon reference to the accompanying drawings in which:

FIG. 1 is a block diagram of an electronic system incorporating subsystems, each of which is clocked by a clocking signal;

FIG. 3 is a graph of a downward count applied to a first multiplexer depicted in FIG. 2 for selecting an earlier phase of a reference clock to compensate for the clocking signal lagging a phase of the reference clock selected by a second multiplexer; and FIG. 4 is a graph of an upward count applied to the first multiplexer depicted in FIG. 2 for selecting an later phase of a reference clock to compensate for the clocking signal leading a phase of the reference clock selected by the second multiplexer.

Figure 2:
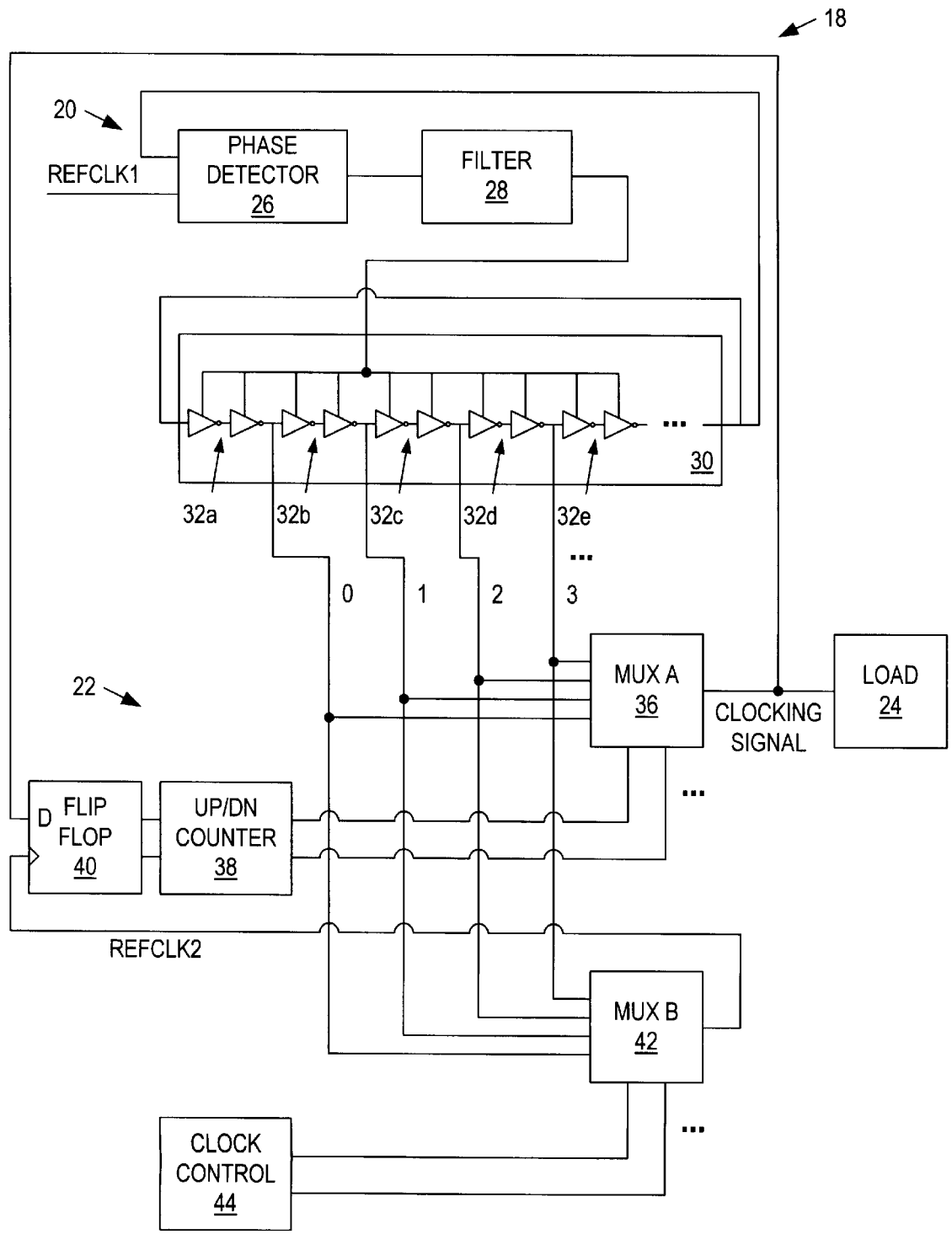
FIG. 2 is a block diagram of a circuit employing an analog and a digital phase-locked loop (PLL) to compensate for skew induced upon the clocking signal.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates an electronic system, according to one example. System 10 may include a set of subsystems 12a and 12b linked by a bus 14. Bus 14 includes multiple conductors which may carry data, address and control signals. One of the control signals may be a clocking signal. Accordingly, FIG. 1 illustrates a conductor 16 used to transmit the clocking signal from a source to each subsystem 12, according to one example. Thus, the electronic system may involve a computer system employing multiple subsystems or input/output device (i.e., peripheral devices) coupled to receive the clocking signal. For example, subsystems may include hard disk drives, floppy drives, an electronic display, and a printer, or any other device which is physically separate from a monolithic printed circuit board on which a processor is either directly or indirectly coupled. Input/output subsystems contained separate from the processor-embodied board are hereinafter referred to as peripheral devices. Thus, peripheral devices are mechanically separate from the printed circuit "motherboard" (i.e., board having sockets into which the processor-embodied board can be coupled, or sockets into which leads of the processor can be coupled).

It may be desired that the clocking signal arriving at select subsystem be synchronized. More specifically, the clocking signal sent to respective loads of subsystems 12a and 12b should arrive at the same time if operation of system 10 is synchronized among subsystems 12a and 12b. A control unit 18a and 18b may be attributed to each subsystem to ensure concurrent receipt of the clocking signal upon the respective loads. The control unit is henceforth referred to as a clock generation circuit which compensates for clock skew differences caused by loading differential of the various loads among subsystems.

FIG. 2 is a block diagram of clock generation circuit 18. Circuit 18 includes a first PLL 20 and a second PLL 22. First PLL 20 is used to produce a plurality of phases from a first reference clock (REFCLK1). One of the phases is selected as a second reference clock (REFCLK2), and the second reference clock is compared with the clocking signal by the second PLL to synchronize phase and/or transitions of the clocking signal with the second reference clock. PLL 22 selects an appropriate phase of the first reference clock and drives that phase upon the clocking signal. The phase driven onto the clocking signal will cause the clocking signal to skew forward or backward in time and therefor to effectively offset any skew attributed to the clocking signal by virtue of load 24.

First PLL 20 is essentially an analog PLL comprising a phase detector 26, a filter (in most instances a low-pass filter) 28 and a voltage-controlled oscillator ("VCO") 30. Alternatively, block 30 is thought of as a VCO having a delay feature. Thus, block 30 provides a delay from its input to its output with several "taps" derived from block 30 between the input and output. Phase detector consists of a device which produces an output voltage proportional to the phase difference between the first reference clock and the output of VCO 30. VCO 30 is in a circuit which produces a periodic output frequency proportional to an input control voltage. Shown in FIG. 2, output from filter 28 is a DC voltage used to apply power to the various inverters 32 which, in this instance, forms VCO 30. For example, a larger DC voltage at the output of filter 28 will increase the power supply margins of each inverter 32 to commensurately decrease the transitional speed of VCO 30. It is recognized that the number of inverters 32 which form VCO 30 is an odd number greater than one, and the output of VCO 30 is connected to the input to sustain oscillation.

VCO 30 formed as a series of inverters includes a plurality of taps. For example, the first tap denoted as "0" is drawn from the output of the first pair of inverters 32a. Subsequent taps 1, 2, 3, etc. are drawn from downstream inverter pairs, as shown. The number of inverters 32 and consequently the number of taps can vary beyond the number shown and, in a preferred instance, can equal thirty two. It is recognized that the first tap denoted as "0" produces a phase of the first reference clock earlier than the phase produced by the second tap denoted as "1". Using an inverter chain and drawing taps from inverter pairs ensures that a plurality of phases can be produced from the first reference clock, each phase being spaced identically from another phase. According to another embodiment, higher resolution can be achieved be drawing the taps between a signal inverter and correcting inverse polarity by placing another inverter on every other tap output.

Second PLL 22 is deemed a digital PLL, whereby a first multiplexer 36 selects a phase output from among the plurality of taps depending on the status of an up-down counter 38. If the count value dispatched from counter 38 is, for example, an up count of one, then first multiplexer 36 selects, e.g., tap 2 as the current tap and/or phase instead of the previous tap 1. The up or down count value dispatched from counter 38 depends on the output of flip-flop 40.

Flip-flop 40 can be, for example, a D-type flip-flop having a clocking input and a D input as well as a Q output and a Q bar (i.e., inverted Q) output. The operation of flip-flop 40 is better illustrated in reference to FIGS. 3 and 4 described herein below. Discussion of the operation will follow in conjunction to describing FIGS. 2, 3 and 4 in combination.

A second multiplexer 42 selects a particular tap or phase from the output of a respective inverter 32 based on the select signal forwarded from clock control 44. Clock control 44 is programmable by the user to select a particular phase. According to one advantage, the same phase can be selected across multiple second PLL 22 attributed to multiple subsystems regardless of the loads associated with those subsystems. The programmable phase selected by clock control 44 is consistently established across the multiple subsystems so that the clocking signal produced by the compensation mechanism of multiple second PLLs 22 ensures that each transitions of the clocking signal arrives at respective subsystems at approximately the same time. Compensation for differences in clock skew among the subsystems based upon varying loads is achieved by the present feedback mechanism of second PLL 22. For each subsystem clocking signal, a feedback is presented to a respective PLL 22. Differences in phases of each feedback clocking signal due to differences in loading will cause differing adjustments of the respective clocking signal. Adjustments are achieved by the first multiplexer 36 selecting either an earlier or a later phase of the first reference clock depending upon the amount of skew associated with the feedback clocking signal. Skews being dissimilar across multiple subsystems ensures differing phases are selected by first multiplexer 36 commensurate with the differing loads and/or skews.

Referring to FIGS. 2 and 3 in conjunction, an example is provided of the mechanism by which multiplexer 36 chooses and earlier phase to be placed upon the clocking signal based on the previous sampled clocking signal portion lagging the second reference clock. If the clocking signal fed back to the input of flip-flop 40 transitions to a high logic state subsequent to the second reference clock transitioning to that state, then the clocking signal is said to be out-of-phase and therefore lagging the second reference clock. This causes flip-flop 40 to produce a negative-going signal at the Q output and a positive-going signal at the Q bar output. The Q output is placed into the up-count input of counter 38, whereas the Q bar output is fed into the down-count input of counter 38. The lagging clocking signal fed back to flip-flop 40 produces a down count value output from counter 38 and placed into multiplexer 36. Multiplexer 36 transitions its selection from a previous count to the next lowest count number (e.g., from count number 2 to count number 1) upon receiving a one-count reduction from counter 38.

FIG. 4 illustrates instances in which the clocking signal is out-of-phase with the second reference clock and is shown leading the reference clock. In this instance, flip-flop 40 will produce a positive-going output from Q bar into the up-count input of counter 38. This causes a corresponding increase in the count number from the previous number.

It is understood that the clocking signal shown in FIGS. 3 and 4 is the previous clocking signal sampled at load 24 and possibly skewed as a result of that load. The clocking signal, however, is subsequently adjusted to that the current clocking signal resulting from a change in count and/or taps selected from VCO 30, will align in phase with the second reference clock (REFCLK2). Thus, it is noted that the clocking signal will be adjusted from that shown in FIGS. 3 and 4 to eventually align in-phase with the second reference clock after one or more transitions are transferred through the selection unit of the second PLL 22. The selection unit comprises flip-flop 40, up/down counter 38 and multiplexer 36.

It is further recognized that FIGS. 2, 3 and 4 illustrate on-the-fly modification of the clocking signal phase and setting that phase relative to a second reference clock. Importantly, the second reference clock can be established at critical subsystems as having the same phase appropriately set by clock control unit 44. When it is needed that clock transitions arrive concurrently at those critical subsystems, a second reference system can be generated in synch across each of those subsystems and skew, caused by differing loads within those subsystems, can be offset using the feedback of the second PLL 22.

It will be appreciated to those skilled in the art having the benefit of this disclosure that this invention is believed to provide an electronic system, a clock generation circuit and a method thereof for compensating or offsetting skew induced upon a clocking signal such that transitions of the clocking signal arrive at multiple subsystems at the same time. The electronic system preferably includes a first PLL of analog variety and possibly multiple second PLLs of digital variety. The first PLL establishes multiple phases of a first reference clock, and the second PLLs select respective phases from the first reference clock to which clocking transitions on the corresponding subsystems can be synchronized. Accordingly, if the clocking signal is to be fed to multiple subsystems having dissimilar load characteristics, the second PLL automatically adjusts to those dissimilar loads and provides a synchronized transition to each load. Modifications and alternative embodiments of various aspects will be apparent to those skilled in the art in view of this description. It is intended that the following claims be interpreted to embrace all such modifications and changes and, accordingly, the specifications and drawings are to be regarded in an illustrative rather a restrictive sense.

What is claimed is:

1. A clock generation circuit, comprising:
   a clocking signal adapted to clock a load which induces skew upon the clocking signal;
   a first reference clock comprising a plurality of phases, a first phase of which is chosen as a second reference clock; and
   a selection unit coupled to receive the clocking signal and the second reference clock for selecting a second phase of the first reference clock to drive the clocking signal based on the timed relationship between the second reference clock and the clocking signal.

2. The clock generation circuit as recited in claim 1, wherein the selection unit comprises a flip-flop which includes a pair of inputs and a pair of outputs, said pair of inputs are coupled to receive the clocking signal and the second reference clock, and said pair of outputs are coupled to a counter.

3. The clock generation circuit as recited in claim 2, wherein the flip-flop is configured to dispatch a count to the counter if transitions of the second reference clock are skewed from transitions of the clocking signal.

4. The clock generation circuit as recited in claim 1, wherein the count is an up count or a down count depending on whether transitions of the second reference clock leads or lags transitions of the clocking signal.

5. The clock generation circuit as recited in claim 1, wherein the selection unit comprises a first multiplexer coupled to select the second phase dissimilar from the first phase if transitions of the second reference clock are skewed from transitions of the clocking signal.

6. The clock generation circuit as recited in claim 1, further comprising a second multiplexer coupled to choose the second reference clock from the plurality of phases of the first reference clock.

7. The clock generation circuit as recited in claim 1, wherein a timed difference between the first and second phases represents a skew induced upon the clocking signal by the load.

8. The clock generation circuit as recited in claim 1, further comprising:
   a phase detector coupled to receive the first reference clock;
   a filter coupled to receive output from the phase detector; and
   a series-connected plurality of inverters coupled to produce an output forwarded to another input of the phase detector in phase with the first reference clock, wherein a plurality of outputs are dispatched to the selection unit from respective outputs of the plurality of inverters, and wherein a select one of the plurality of outputs transmits the second phase of the first reference clock and another one of the plurality of outputs transmits the first phase of the first reference clock.

9. A computer system, comprising:
   a clocking signal forwarded to a plurality of capacitive and resistive loads, at least one of which may reside separate from a printed circuit board on which a processor is coupled and includes a clock generation circuit for offsetting skew induced upon the clocking signal by a respective one of the plurality of loads, said clock generation circuit includes:
   a first phase-locked loop coupled to receive a first reference clock for generating a signal having a plurality of phases, wherein one of the plurality of phases is equal in phase with the first reference clock;
   a second reference clock selected from a first phase of the plurality of phases; and
   a second phase-locked loop coupled to receive the clocking signal and the second reference clock for generating a count value corresponding to a timed relationship between the second reference clock and the clocking signal; and
   a first multiplexer coupled to (i) receive the count value and select a second phase from the plurality of phases which corresponds to the count value, and to (ii) drive the clocking signal with the second phase.

10. The computer system as recited in claim 9, wherein the first phase-locked loop comprises:
    a voltage controlled oscillator coupled to produce said one of the plurality of phases; and
    a phase detector coupled to receive the first reference clock and said one of the plurality of phases fed back from the voltage controlled oscillator such that said one of the plurality of phases is adapted for being locked in phase with the first reference clock.

11. The computer system as recited in claim 10, wherein the voltage controlled oscillator comprises a series-connected plurality of inverters, and wherein each of plurality of inverters produces a respective one of the plurality of phases, and wherein the latest phase of the plurality of phases is of similar phase to the first reference clock.

12. The computer system as recited in claim 9, wherein the second phase-locked loop comprises:
    a flip-flop coupled to produce an output dependent on the timed relationship between the clocking signal and the second reference clock; and a counter coupled to receive the output from the flip-flop in one of two inputs of the counter depending on whether the count value is an upward count or a downward count.

13. The computer system as recited in claim 12, wherein an upward count will cause the first multiplexer to select the second phase to lag the first phase.

14. The computer system as recited in claim 12, wherein an downward count will cause the first multiplexer to select the second phase to lead the first phase.

15. The computer system as recited in claim 9, further comprising a second multiplexer programmably controlled to select the second reference clock from among the plurality of phases and present the second reference clock to the second phase-locked loop.

16. A method to compensate for skew-induced loading upon a clocking signal, comprising:

feeding back a voltage controlled oscillator output to a first phase-locked loop and locking the voltage-controlled oscillator output in phase with a first reference clock;

selecting a first phase of the voltage-controlled oscillator output as a second reference clock; and feeding back the clocking signal to a second phase-locked loop and locking the clocking signal in phase with the second reference clock by selecting a second phase of the voltage-controlled oscillator output to be driven upon the clocking signal.

17. The method as recited in claim 16, wherein said feeding back of the clocking signal comprises selecting the second phase based on the amount of skew-induced loading upon the clocking signal.

18. The method as recited in claim 16, wherein said selecting the first phase comprises deriving an output from among numerous series-connected inverters which comprise the voltage-controlled oscillator.

19. The method as recited in claim 16, further comprising:

providing a plurality of phases skewed in time relative to the voltage-controlled oscillator output;

comparing the clocking signal to the second reference clock and generating a count value dependent on that comparison;

assigning each of the plurality of phases to a count; and selecting a unique one of the plurality of phases as the second phase if the generated count value equals the count assigned to the second phase.

20. The method as recited in claim 16, wherein a time difference between the first and second phases of the voltage-controlled oscillator output is substantially equal to skew-induced loading on the clocking signal.

21. The method as recited in claim 16, wherein the second phase precedes the first phase if the clocking signal lags the second reference clock.

22. The method as recited in claim 16, wherein the second phase is subsequent to the first phase if the clocking signal leads the second reference clock.

* * * * *